United States Patent [19]

Sugawara et al.

[11] Patent Number: 5,219,639

[45] Date of Patent: Jun. 15, 1993

[54] MULTILAYER STRUCTURE AND ITS FABRICATION METHOD

[75] Inventors: Noritoshi Sugawara, Kanagawa; Kazuaki Satoh, Tokyo, both of Japan

[73] Assignee: Fujitsu Limited, Kawasaki, Japan

[21] Appl. No.: 665,072

[22] Filed: Mar. 6, 1991

[30] Foreign Application Priority Data

Mar. 7, 1990 [JP] Japan ................. 2-055547

[51] Int. Cl.$^5$ ............................. B32B 9/00
[52] U.S. Cl. ............................. 428/209; 428/901; 174/262; 174/264; 174/261
[58] Field of Search ............. 428/209, 901; 174/262, 174/264, 261

[56] References Cited

U.S. PATENT DOCUMENTS

| | | | |
|---|---|---|---|
| 3,921,285 | 11/1975 | Krall | 29/626 |
| 4,328,531 | 5/1982 | Nagashima et al. | 174/262 |
| 4,736,521 | 4/1988 | Dohya | 29/830 |

FOREIGN PATENT DOCUMENTS

| | | |
|---|---|---|
| 0040905 | 12/1981 | European Pat. Off. |
| 1483563 | 6/1967 | France |
| 2468279 | 4/1981 | France |
| 2649829 | 1/1991 | France |
| WO85/02751 | 6/1985 | PCT Int'l Appl. |
| WO88/09599 | 12/1988 | PCT Int'l Appl. |

OTHER PUBLICATIONS

Research Disclosure, "Dendrite Connectors for Low Temperture System Packaging", No. 309, p. 44, abstract No. 30964, Jan. 1990.

Primary Examiner—Patrick J. Ryan
Assistant Examiner—Cathy K. Lee
Attorney, Agent, or Firm—Staas & Halsey

[57] ABSTRACT

A multilayer structure of the invention is fabricated by patterning a first electrically conductive layer on an insulative substrate; coating a polyamic acid resin layer all over the first electrically conductive layer; piercing a metal pin into the resin layer so that a first end of the pin contacts and is cold-welded to the first electrically conductive layer; hardening said polyamic acid resin to become polyimide resin; and patterning a second electrically conductive layer over the resin layer and the second end of the pin exposed from the surface of the resin layer. The cold-welding of the pin to the first conductive layer allows a reliable connection thereof. Moreover, this structure and method allow an improved flatness of each layer, resulting in an achievement of a larger number of the multilayers without the prior art problem of pattern breakage caused from less flat layers. The polyimide resin, which is not required to be photosensitive in the above fabrication method, can be employed so that its thermal expansion coefficient is same as the pin. Accordingly, no thermal stress is generated at the connection between the pin and the second conductive layer, resulting in an improved reliability of the connection.

9 Claims, 2 Drawing Sheets

MULTILAYER STRUCTURE AND ITS FABRICATION METHOD

BACKGROUND OF THE INVENTION

1. Field of the Invention

The present invention is related to a multilayer structure employed in a hybrid IC (integrated circuit) or a semiconductor device, etc. More particularly, it is related to connection of the electrically conductive layers insulated by a resin layer therebetween.

2. Description of the Related Arts

There have been employed many kinds of multilayer structures and their fabrication methods for fabricating hybrid ICs (integrated circuit) or semiconductor devices. A typical one of them is Japanese Unexamined Patent Publication Sho-61-22693 shown in FIGS. 1a–1c. In this method, an insulative layer 34 is coated over an electrically conductive pattern 33 formed on an insulative substrate 31; and a via hole 34a is opened on a predetermined position of insulative layer 34 as shown in FIG. 1a. Via hole 34a is then filled with a metal material by either electroplating or electroless plating so that a via 35 is formed therein as shown in FIG. 1b. A second electrically conductive pattern 36 is formed over thus fabricated insulative layer 34, as shown in FIG. 1c.

This method, however, causes problems as described hereinafter. That is, it requires a very long time, such as more than 24 hours, for forming the 20 $\mu$m thick via in the via hole by electroless plating. The required time can be reduced by employing electroplating; however, not only the via top uneven relative to the surface of insulative layer 34 but also there remains a mechanical stress at the connection of second pattern 36 and peripheral part of via 35 after second pattern 36 is formed, resulting in a possibility of causing disconnection thereof. This is because a photosensitive polyimide resin employed for insulative layer 34 has a thermal expansion coefficient widely different from that of the metal material of via 35. Therefore, another problem is also caused in that the via does not adequately adhere to the insulative layer. Resulting from these problems, the reliability of the connection between the multilayers has not been satisfactory.

In order to avoid the mismatch problem of the thermal expansion coefficients, an employment of a non-photosensitive polyimide resin can be considered; however, it is disadvantageous that this material requires a metal mask or a resist which is resistant to plasma, which requires a complicated fabrication process, resulting in the deterioration of the process reliability.

SUMMARY OF THE INVENTION

It is a general object of the invention, therefore, to provide a multilayer structure and its fabrication methods, where two electrically conductive layers insulated by a resin layer therebetween are reliably connected.

It is another object of the invention to provide a multilayer structure and its fabrication methods, where the improved flatness of each layer allows an increased number of the multiple layers.

A multilayer structure is fabricated by forming a first electrically conductive pattern on an insulative substrate; coating an insulative resin layer all over the first electrically conductive pattern; piercing a metal pin into the resin layer so that a first end of the pin contacts and is cold-welded to the first electrically conductive pattern; hardening the insulative resin layer; and forming a second electrically conductive pattern over the resin layer and over the second end of the pin exposed from the surface of the resin layer.

The above-mentioned features and advantages of the present invention, together with other objects and advantages, which will become apparent, will be more fully described hereinafter, with reference being made to the accompanying drawings which form a part thereof, wherein like numerals refer to like parts throughout.

DESCRIPTION OF THE PREFERRED EMBODIMENTS

Figure 1A:
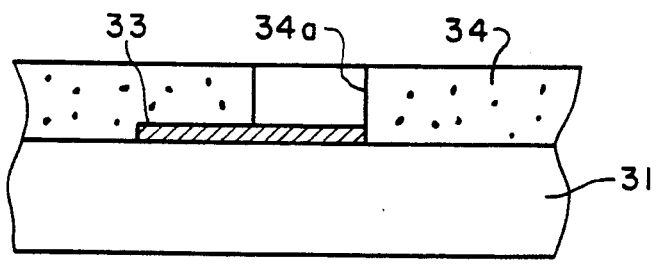
FIGS. 1a–1c schematically illustrate fabrication steps of a prior art multilayer structure.
Figure 1B:
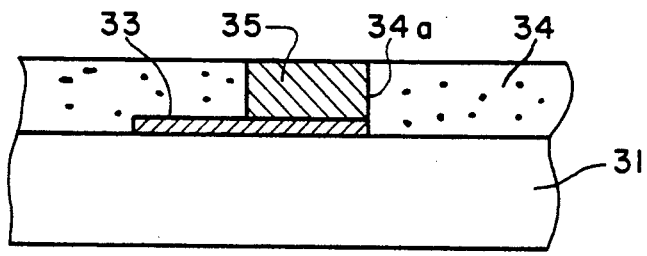
Figure 1C:
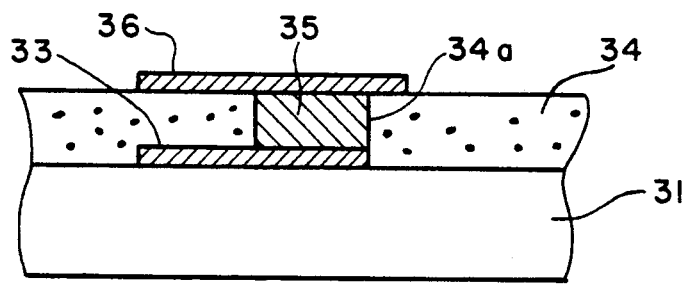
Figure 2:
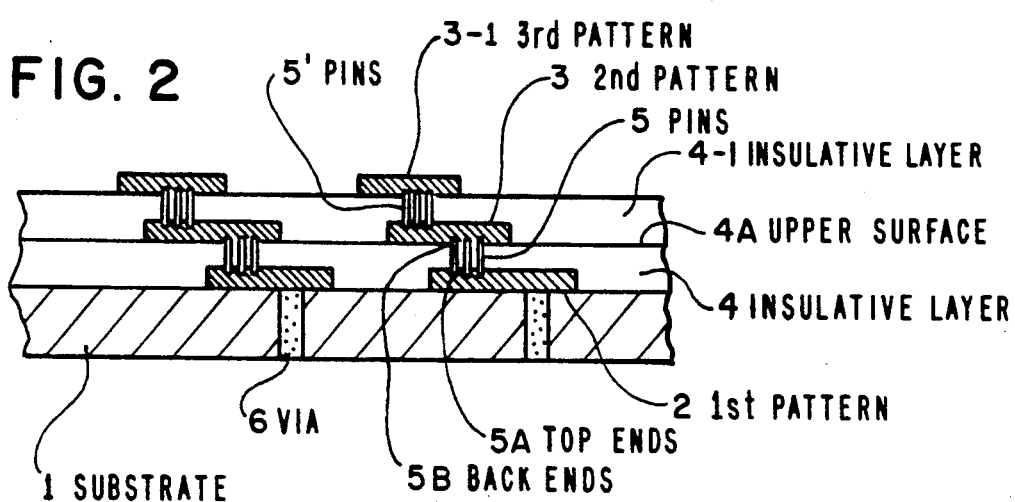
FIG. 2 schematically illustrates a preferred embodiment of the present invention.

The present invention is hereinafter described in detail, referring to preferred embodiments shown in FIG. 2 and FIGS. 3a–3i. FIG. 2 schematically illustrates a cross-sectional view of a preferred embodiment of the present invention. FIGS. 3a–3i schematically illustrate the fabrication steps according to the present invention. Same of like reference numerals designate same or corresponding parts throughout the drawings.

As shown in FIG. 2, a first electrically conductive pattern 2 deposited upon an insulative substrate 1 formed of, for example, ceramic is connected to a second electrically conductive pattern 3 deposited upon a first insulative layer 4 coated all over first pattern 2 and substrate 1, by pins 5 which pierce insulative layer 4 made of resin. Furthermore, a second insulative layer 4-1 is coated all over the surface 4A of first insulative layer and second pattern 3. Upon second insulative layer 4-1, a third electrically conductive pattern 3-1 is deposited, from which pins 5' pierce second insulative layer 4-1 so as to connect to second pattern 3. Thus, first, second and third patterns 2, 3 and 3-1 are connected with each other. Substrate 1 also has vias 6 so as to communicate to first pattern 2 from the bottom side of substrate 1.

Figure 3A:
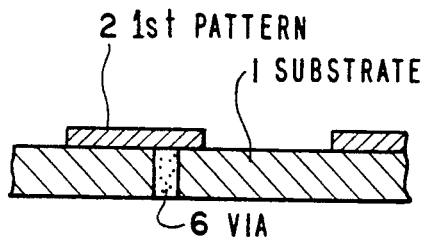
FIGS. 3a–3i schematically illustrate fabrication steps of the electrically conductive layer structure of the FIG. 2 embodiment.

Fabrication steps of the FIG. 2 multilayer structure are explained hereinafter in reference to FIGS. 3a–ei. Substrate 1, generally formed of ceramic, is already provided with vias 6 according to a widely known technique. A wiring pattern 2 is fabricated with a relatively soft electrically conductive material, such as aluminum or copper, as thick as 7 $\mu$m upon a predetermined portion of substrate 1, according to a widely known technique, as shown in FIG. 3a.

Figure 3B:
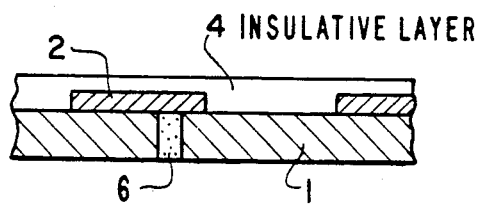

Polyamic acid resin, which is a material that becomes a non-photosensitive polyimide resin, or for some cases a solution of polyimide, is coated flatly all over substrate 1 having first pattern 2 thereon as thick as 10 to 20 $\mu$m, so as to form first insulative layer 4, as shown in FIG. 3b.

Figure 3C:
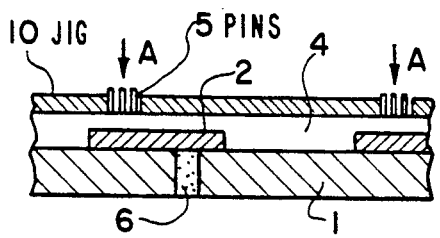

On the other hand, a plurality of whiskers of 5–10 $\mu$m diameter, and 30±1 $\mu$m long, typically of molybdenum or tungsten, typically plated with chrome, are prepared. A jig 10 made with an approximately 20 $\mu$m thick stainless sheet having holes of approximately 80 $\mu$m diameter is placed on insulative layer 4. The holes are located at the plate where the pins 5 are to be provided later for connecting first and second patterns 2 and 3. Then, an appropriate number of pins 5, for example, 5 and 8, are inserted into the holes by the use of an appropriate tool, which is not shown in the figure, as shown in FIG. 3c.

Figure 3D:
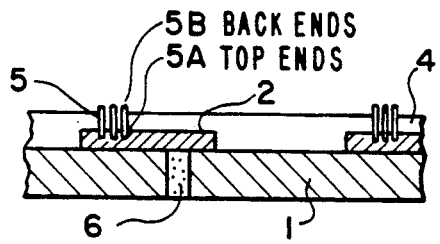

Back ends 5B of pins 5 are pressed down along arrow A into the resin layer by a tool, which is not shown in the figure, so that the pins 5 pierce insulative layer 4 to reach first pattern 2. The polyamic acid resin is so soft as to allow the pins made of hard metal whisker to easily pierce the resin layer and to adhere therewith; furthermore, to allow their pointed ends 5A to press the first pattern 2 so as to be cold-welded therewith. The chrome plated over the pins also reacts with the polyamic acid resin. Due to these facts, good adhesion is achieved between the resin and the pins. Back ends 5B of pins 5 are then protruding from the top surface level of insulative layer 4 by some degree, such as 3 to 5 $\mu$m. Next, the substrate having jig 10 removed, as shown in FIG. 3d, and having the resin layer thereon is heated at 350 degrees to 450 degrees C. for 30 to 60 minutes so that the resin is hardened to become polyimide.

Next, back ends 5B of pins 5 are mechanically ground to level the height, if needed. Usually, this process shown as FIG. 3e is not necessary, because this process is required only when the back ends 5B are excessively unequal or too high from the upper surface 4A of insulative layer 4.

Figure 3E:
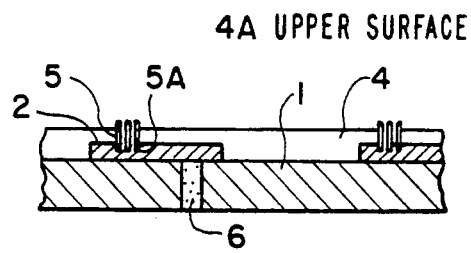
Figure 3F:
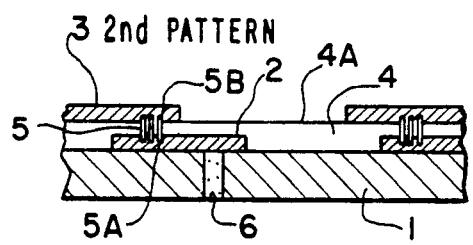

Next, an electrically conductive soft metal, such as copper, is formed over insulative resin 4 by a widely known electroplating technique, which is then patterned according to a widely known photolithography technique so as to form second pattern 3, as shown in FIG. 3f. Back ends 5B of pins 5 are surely connected with the plated material, i.e. second pattern 3, by this plating process, because the back ends 5B are protruding from the upper surface 4A of insulative layer 4. This plating is carried out as thick as approximately 7 $\mu$m on a flat portion; however, deposition by the plating can be reduced particularly on the 3-5 $\mu$m protruding back ends 5B of pins 5 according to a widely known leveling effect of plating technique. Therefore, surface of second pattern 3 can be finished adequately flat over pins 5. Thus, the first and second patterns 2 and 3 are connected with each other by pins 5.

Figure 3G:
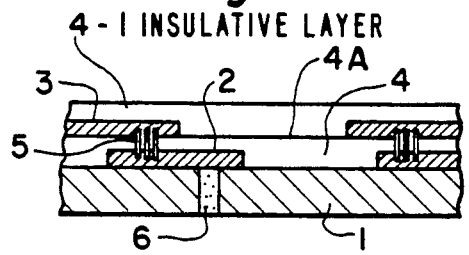

Next, non-photosensitive polyimide resin is coated all over first insulative layer 4 having second pattern 3 thereon by the same way as described with respect to FIG. 3b, in order to form second insulative layer 4-1, as shown in FIG. 3g.

Figure 3H:
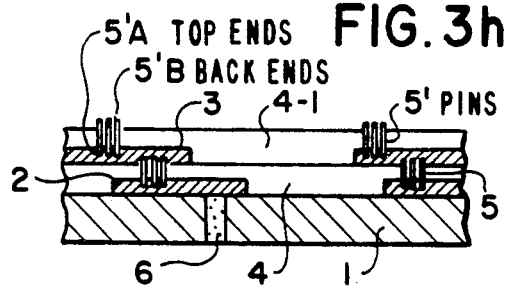

Next, another bunch of pins 5', as shown in FIG. 3h, are pressed into polyimide resin layer 4-1, and further pressed into second pattern 3 by the same methods as described with respect to FIGS. 3c-3d or with respect to FIGS. 3c-3e.

Figure 3I:
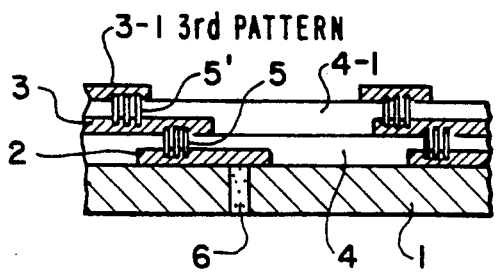

Next, a third electrically conductive pattern 3-1 is formed over second insulative layer 4-1 and over the back ends 5'B of pins 5' by the same method as the first and second patterns. As described above for second pattern 3, third pattern 3-1 can be made adequately flat even over back ends 5'B of pins 5', as shown in FIG. 3i.

Therefore, the problems that frequently take place in the prior art structure, such as disconnection of the wiring due to the steep level differences caused by the layers and the vias, in fabricating second insulative layer 3 and third patter 3-1 thereon can be solved. Consequently, a multilayer structure having an increased number of layers relative to the prior art can be achieved without deteriorating the reliability of the connection of the multilayers.

In the above inventive structure and fabrication process, a non-photosensitive polyimide resin can be employed for insulative layers 4 and 4-1 instead of photosensitive polyimide resin. Non-photosensitive polyimide resins are available in a much wider range of thermal expansion coefficients than photosensitive polyimide resins. Accordingly, a non-photosensitive polyimide resin which satisfactorily matches the thermal expansion coefficient of the pins can be easily selected for the insulative layers. Moreover, the pins contact the resin prior to the hardening of the resin; therefore, good adhesion is sufficiently achieved therebetween. Therefore, heat cycles during the field operation of the multilayer devices cause no mechanical stress at the connection point of the pins and the first and second patterns. Furthermore, the pins are cold-welded to the first pattern, as well as have enough area to be surely plated with the second pattern. As a result of these facts the causes which break the connection between the pins and patterns are removed, so that the reliability of the multilayer devices is improved to be excellent.

Moreover, in the present invention the process to open via holes on the insulative layer, for connecting the lower pattern and the upper pattern, is not necessary; accordingly, the steps of photolithography and the subsequent etching process are not necessary, resulting in simple fabriation procedures.

Though in the preferred embodiment the quantity of the pins is referred to 5 to 6 per via, the pin quantity can be arbitrarily chosen depending on the requirement. Signal propagation characteristics of the via can be adjusted by the quantity of the pins.

Though in the preferred embodiment substrate 1 has via holes 6 therein, it is apparent that the present invention can be embodied for a substrate having no vias therein.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not intended to limit the invention and accordingly, all suitable modifications are equivalents may be resorted to, falling within the scope of the invention.

What is claimed is:

1. A multilayer structure comprising:
   an insulative substrate;
   a first electrically-conductive pattern formed on said insulative substrate;
   an insulative layer formed on said insulative substrate having said first electrically-conductive pattern thereon;
   a second electrically-conductive pattern formed on said insulative layer; and
   a plurality of electrically conductive pins piercing said insulative layer so as to connect said electrically conductive patterns, a first end of each of said pins being cold-welded to said first electrically conductive pattern, a second end of each of said pins contacting said second electrically conductive pattern.

2. A multilayer structure as recited in claim 1, wherein said pins are grouped.

3. A multilayer structure as recited in claim 1, wherein said pins are plated with chrome.

4. A multilayer structure as recited in claim 1, wherein said insulative layer is formed of an organic (plastic) resin.

5. A multilayer structure as recited in claim 4, wherein said insulative layer is formed of a non-photosensitive material.

6. A multilayer structure as recited in claim 5, wherein said non-photosensitive material is polyimide.

7. A multilayer structure as recited in claim 4, wherein said insulative layer has a thermal expansion coefficient which is approximately equal to the thermal expansion coefficient of each of said pins.

8. A multilayer structure as recited in claim 1, wherein each of said pins has a diameter of about 5 to 10 μm.

9. A multilayer structure as recited in claim 1, wherein said first end of each of said pins is pointed.

* * * * *